(12) United States Patent
Chen

(10) Patent No.: US 10,921,364 B2
(45) Date of Patent: Feb. 16, 2021

(54) STRUCTURE AND TESTING DEVICE FOR MEASURING THE BONDING STRENGTH OF THE LIGHT-EMITTING PANEL

(71) Applicant: Wuhan China Star Optoelectronics Semiconductor Display Technology Co., Ltd., Wuhan (CN)

(72) Inventor: Huipeng Chen, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 140 days.

(21) Appl. No.: 16/471,581

(22) PCT Filed: Apr. 10, 2019

(86) PCT No.: PCT/CN2019/081989
§ 371 (c)(1),
(2) Date: Jun. 20, 2019

(87) PCT Pub. No.: WO2020/118980
PCT Pub. Date: Jun. 18, 2020

(65) Prior Publication Data
US 2020/0191858 A1    Jun. 18, 2020

(30) Foreign Application Priority Data

Dec. 12, 2018 (CN) .......................... 201811519996.1

(51) Int. Cl.
*G01R 31/26* (2020.01)
*H01L 51/00* (2006.01)
(Continued)

(52) U.S. Cl.
CPC ...... *G01R 31/2635* (2013.01); *H01L 51/0097* (2013.01); *H01L 51/56* (2013.01);
(Continued)

(58) Field of Classification Search
CPC .... G01R 31/00; G01R 31/26; G01R 31/2607; G01R 31/2632; G01R 31/2635;
(Continued)

(56) References Cited

U.S. PATENT DOCUMENTS 9,575,281 B2 * 2/2017 Tanazawa ............... G02B 3/005
2011/0217546 A1 * 9/2011 Nomura .................. G02F 1/172
428/336
(Continued)

FOREIGN PATENT DOCUMENTS

| CN | 101206173 | 6/2008 |
|---|---|---|
| CN | 104395794 | 3/2015 |

(Continued)

*Primary Examiner* — Hoai-An D. Nguyen

(57) ABSTRACT

The structure and the testing device used for measuring the bonding strength of the light-emitting panel, including: a substrate, a flip chip film is disposed on the substrate, and a bonding portion of the flip chip film is bonded to the substrate. Wherein an orthographic projection of a non-bonding portion of the flip chip film on the substrate covers an orthographic projection of the bonding portion on the substrate, and the non-bonding portion is stretched to measure a bonding strength between the flip chip film and the substrate, thereby reducing the risk of breakage between the layers inside the substrate, thereby the bonding strength between the flip chip film and the substrate can be measured more accurately.

13 Claims, 3 Drawing Sheets

(51) Int. Cl.
*H01L 51/56* (2006.01)
*H01L 51/50* (2006.01)

(52) U.S. Cl.
CPC ...... *G01R 31/2632* (2013.01); *H01L 51/0096* (2013.01); *H01L 51/50* (2013.01)

(58) Field of Classification Search
CPC . H01L 51/00; H01L 51/0096; H01L 51/0097; H01L 51/50; H01L 51/56; Y02E 10/00; Y02E 10/50; Y02E 10/549
USPC ....... 324/500, 537, 762.01, 762.07; 345/156, 345/183, 30, 33, 35, 39, 55, 82
See application file for complete search history.

(56) References Cited

U.S. PATENT DOCUMENTS

| | | |
|---|---|---|
| 2016/0085005 A1 | 3/2016 | Nam et al. |
| 2017/0186916 A1* | 6/2017 | Shioji ................ H01L 33/46 |
| 2017/0210062 A1* | 7/2017 | Chen ................ B29C 63/0052 |
| 2018/0195951 A1 | 7/2018 | Shin et al. |
| 2019/0296098 A1* | 9/2019 | Cheng ................ H01L 51/5253 |
| 2020/0083473 A1* | 3/2020 | Gu ................ H01L 27/3244 |

FOREIGN PATENT DOCUMENTS

| | | |
|---|---|---|
| CN | 104596923 | 5/2015 |
| CN | 105938806 | 9/2016 |
| CN | 205638484 | 10/2016 |
| CN | 106769846 | 5/2017 |
| CN | 207953479 | 10/2018 |

\* cited by examiner

STRUCTURE AND TESTING DEVICE FOR MEASURING THE BONDING STRENGTH OF THE LIGHT-EMITTING PANEL

RELATED APPLICATIONS

This application is a National Phase of PCT Patent Application No. PCT/CN2019/081989 having International filing date of Apr. 10, 2019, which claims the benefit of priority of Chinese Patent Application No. 201811519996.1 filed on Dec. 12, 2018. The contents of the above applications are all incorporated by reference as if fully set forth herein in their entirety.

FIELD AND BACKGROUND OF THE INVENTION

The present disclosure relates to the field of display technologies, and more particularly to a structure and a testing device for measuring a bonding strength of a light-emitting panel.

In recent years, with rapid development of organic light-emitting diode (OLED) display technologies, And due to OLED products' advantages of lightness, fast response, wide viewing angle, high contrast, and bendable etc. OLED products have received more and more attention and have various applications. OLED products are mainly used in various display technology fields such as mobile phones, tablets and televisions.

In the current technologies, when packaging an OLED, it is usually necessary to attach a chip on film (COF) on a substrate for bonding a soft additional circuit board as a package chip to the substrate, but when measuring a bonding strength of the COF to the substrate, a measurement inaccuracy is often caused by an interlaminar fracture between the substrates.

Therefore, the current technologies have drawbacks and require for improvement.

SUMMARY OF THE INVENTION

An embodiment of the present disclosures a structure and a testing device for measuring the bonding strength of the light-emitting panel, which can accurately measure a bonding strength of a flip chip film and a substrate, and reduce the risk of breakage between the layers inside the substrate.

In a first aspect, an embodiment of the present disclosures a structure for measuring a bonding strength of a light emitting panel, including:

A substrate on which a flip chip film is disposed, and a bonding portion of the flip chip film is bonded to the substrate.

An orthographic projection of the non-bonding portion of the flip chip film on the substrate covers an orthographic projection of the bonding portion on the substrate, and the non-bonding portion is stretched to measure a bonding strength of the flip chip film and the substrate.

In the structure for measuring the bonding strength of the light-emitting panel described in the present disclosure, a stretching direction of the non-bonding portion is an inclined direction of the non-bonding portion.

In the structure for measuring the bonding strength of the light-emitting panel described in the present disclosure, a bent portion is formed between the bonding portion and the non-bonding portion, and the flip chip film is bent by the bent portion.

In the structure for measuring the bonding strength of the light-emitting panel described in the present disclosure, the bent portion is aligned with an end of the substrate.

In the structure for measuring the bonding strength of the light-emitting panel described in the present disclosure, a horizontal length of the bonding portion is smaller than a horizontal length of the non-bonding portion to cause a mechanical arm to stretch the non-bonding portion.

In the structure for measuring the bonding strength of the light-emitting panel described in the present disclosure, the substrate includes a bottom plate and a flexible layer, the flexible layer covering the substrate by stretching the non-bonding portion to prevent the flexible layer from separating from the bottom plate.

In the structure for measuring the bonding strength of the light-emitting panel described in the present disclosure, a first surface of the flip chip film is a smooth surface to reduce a friction between the non-bonding portion and the bonding portion when the non-bonding portion is stretched.

In the structure for measuring the bonding strength of the light-emitting panel described in the present disclosure, the substrate includes: a bottom plate and a flexible layer, the flexible layer covering the bottom plate.

In the structure for measuring the bonding strength of the light-emitting panel described in the present disclosure, the flexible layer is made of a polymer material such as polyimide.

In a second aspect, the embodiment of the present further disclosures a testing device for measuring a bonding strength of a light emitting panel, including:

A mechanical arm and a slide rail, the mechanical arm being connected to the slide rail by a pulley at the end; and The mechanical arm is configured to fit a non-bonding portion of a flip chip film so that the non-bonding portion covers a bonding portion of the flip chip film, and the non-bonding portion is stretched to measure a bonding strength between the flip chip film and a substrate.

In the testing device for measuring the bonding strength of the light-emitting panel described in the present disclosure, a two sides of the pulleys are oppositely disposed with convex portions so that the pulleys abut against the sliding rails.

In the testing device for measuring the bonding strength of the light-emitting panel described in the present disclosure, the sliding rail is semicircular, so that the non-bonding portion is covered on the bonding portion by being rotated 180°.

In a third aspect, an embodiment of the present disclosures a structure for measuring a bonding strength of a light emitting panel, including:

A substrate on which a flip chip film is disposed, and a bonding portion of the flip chip film is bonded to the substrate; and An orthographic projection of a non-bonding portion of the flip chip film on the substrate covers an orthographic projection of the bonding portion on the substrate, and the non-bonding portion is stretched to measure a bonding strength of the flip chip film and the substrate, wherein a bent portion is formed between the bonding portion and the non-bonding portion, and the flip chip film is bent by the bent portion, and a first surface of the flip chip film is a smooth surface to reduce a friction between the non-bonding portion and the bonding portion when the non-bonding portion is stretched.

The beneficial performance of the present disclosure are as follows:

The structure for measuring the bonding strength of the light-emitting panel provided by the embodiment of the present disclosure includes a substrate, a flip chip film is disposed on the substrate, and a bonding portion of the flip chip film is bonded to the substrate. Wherein an orthographic projection of a non-bonding portion of the flip chip film on the substrate covers an orthographic projection of the bonding portion on the substrate, and the non-bonding portion is stretched to measure a bonding strength between the flip chip film and the substrate, thereby reducing the risk of breakage between the layers inside the substrate, thereby the bonding strength between the flip chip film and the substrate can be measured more accurately.

BRIEF DESCRIPTION OF THE SEVERAL VIEWS OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained from those skilled in the art based on these drawings without paying any creative effort.

DESCRIPTION OF SPECIFIC EMBODIMENTS OF THE INVENTION

Figure 1:
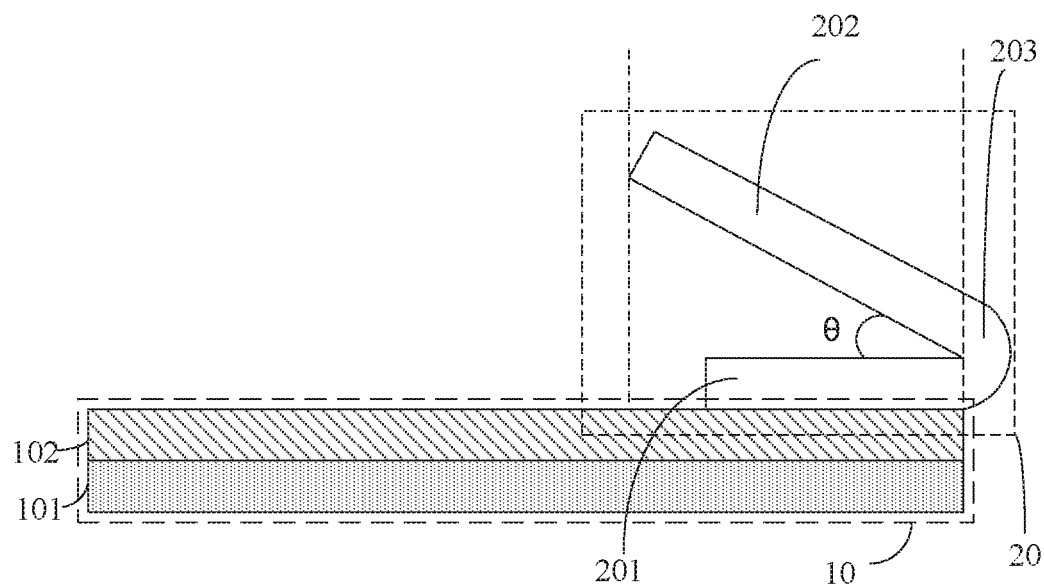
FIG. 1 is a structural diagram of measuring bonding strength of a light-emitting panel according to an embodiment of the present disclosure.

The technical solutions in the embodiments of the present disclosure will be clearly and completely described in the following with reference to the accompanying drawings in the embodiments. It is apparent that the described embodiments are only a part of the embodiments of the present disclosure, and not all of them. All other embodiments obtained by a person skilled in the art based on the embodiments of the present disclosure without creative efforts are within a scope of the present disclosure.

In the description of the present disclosure, it is to be understood that the terms "center", "longitudinal", "transverse", "length", "width", "thickness", "upper", "lower", "front", "post", "left", "right", "vertical", "horizontal", "top", "bottom", "inside", "outside", "clockwise", "counterclockwise", etc. An indicating position or a positional relationship is based on the orientation or positional relationship shown in the drawings, and is merely for the convenience of describing the present disclosure and the simplified description, and does not indicate or imply that the device or component referred to has a specific orientation, and is constructed and operated in a specific orientation. Therefore, it should not be construed as limiting the application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present disclosure, the meaning of "a plurality" is two or more unless specifically and specifically defined otherwise.

In the description of the present disclosure, it should be noted that the terms "installation", "connected", and "connection" are to be understood broadly, and may be fixed or detachable, for example, unless otherwise explicitly defined and defined. Connected, or integrally connected; may be mechanically connected, may be electrically connected or may communicate with each other; may be directly connected, or may be indirectly connected through an intermediate medium, may be internal communication of two elements or interaction of two elements relationship. For those skilled in the art, the specific meanings of the above terms in the present disclosure can be understood on a case-by-case basis.

In the present disclosure, a first feature "on" or "under" a second feature may include direct contact of the first and second features, and may also include first and second features, unless otherwise specifically regulations and restrictions. It is not in direct contact but through additional features between them. Moreover, the first feature "above", "upside" and "on" the second feature includes the first feature directly above and the first feature being obliquely above the second feature, or merely indicating that the first feature level is higher than the second feature. The first feature "below", "under" and "beneath" the second feature includes the first feature directly below and the first feature being obliquely below the second feature, or merely the first feature level being less than the second feature.

The following disclosure provides many different embodiments or examples for implementing the different structures of the present disclosure. In order to simplify the disclosure of the present disclosure, the components and settings of the specific examples are described below. Of course, they are merely examples and are not intended to limit the application. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides examples of various specific processes and materials, but one of ordinary skill in the art will recognize the use of other processes and/or the use of other materials.

In the current technologies, when packaging an OLED, it is usually necessary to attach a chip on film (Chip On Film, COF) on a substrate for bonding a soft additional circuit board as a package chip to the substrate, but when measuring a bonding strength of the COF to the substrate, a measurement inaccuracy is often caused by an interlaminar fracture between the substrates.

Please refer to FIG. 1, FIG. 1 is a structural diagram of measuring bonding strength of a light-emitting panel according to an embodiment of the present disclosure. The structure 100 for measuring the bonding strength of the light-emitting panel includes: a substrate 10, on which a flip chip film 20 is disposed, the bonding portion 201 of the flip chip film 20 is bonded to the substrate 10; among them, The orthographic projection of the non-bonding portion 202 of the flip chip film 20 on the substrate 10 covers the orthographic projection of the bonding portion 201 on the substrate 10, and the non-bonding portion 202 is stretched to measure a bonding strength of the flip chip film 20 and the substrate 10.

It can be understood that in the processing of the OLED product, the flip chip film 20 is partially bonding to the substrate 10, the bonding portion 201 is bonding to the substrate 10, and the orthographic projection of the non-bonding portion 202 on the substrate 10 can cover the bonding. The orthographic projection of the joint portion 201 on the substrate 10 such that the small angle θ formed by the non-bonding portion 202 and the bonding portion 201 is greater than or equal to 0° and less than 90°, so that the non-bonding portion 202 is stretched, an interlayer of the substrate 10 is not broken, and the bonding strength between the flip chip film 20 and the substrate 10 can be accurately measured.

The structure 100 for measuring the bonding strength of the light-emitting panel provided by the embodiment of the present disclosure includes a substrate 10 on which a flip chip film 20 is disposed, and the bonding portion 201 of the flip chip film 20 is bonded to the substrate 10. On the substrate 10; wherein the orthographic projection of the non-bonding portion 202 of the flip chip film 20 on the substrate 10 covers the orthographic projection of the bonding portion 201 on the substrate 10, and the non-bonding portion 202 is stretched to measure a bonding strength between the flip chip film 20 and the substrate 10. The risk of interlaminar fracture within the substrate 10 can be reduced, thereby more accurately measuring the bonding strength of the flip chip film 20 to the substrate 10.

In some embodiments, a bent portion 203 is formed between the bonding portion 201 and the non-bonding portion 202, and the flip chip film 20 is bent by the bent portion 203.

Specifically, since the flip chip film 20 is a bendable material, when the bonding strength between the flip chip film 20 and the substrate 10 is measured, since the bonding portion 201 is bonding to the substrate 10, the non-bonding portion 202 can be freely rotated. Therefore, the non-bonding portion 202 is rotated by the bending portion 203 as a rotation point or an origin to measure the bonding strength.

In some embodiments, the bent portion 203 is aligned with an end of the substrate 10.

In some embodiments, the substrate 10 includes a bottom plate 101 and a flexible layer 102, the flexible layer 102 covering the substrate 10 by stretching the non-bonding portion 202 to prevent the flexible layer 102 from separating from the bottom plate 101.

Here, the stretching direction of the non-bonding portion 202 is stretched in the oblique direction of the non-bonding portion 202.

For example, the flexible layer 102 may be made of a polymer material such as polyimide (PI).

Figure 2:
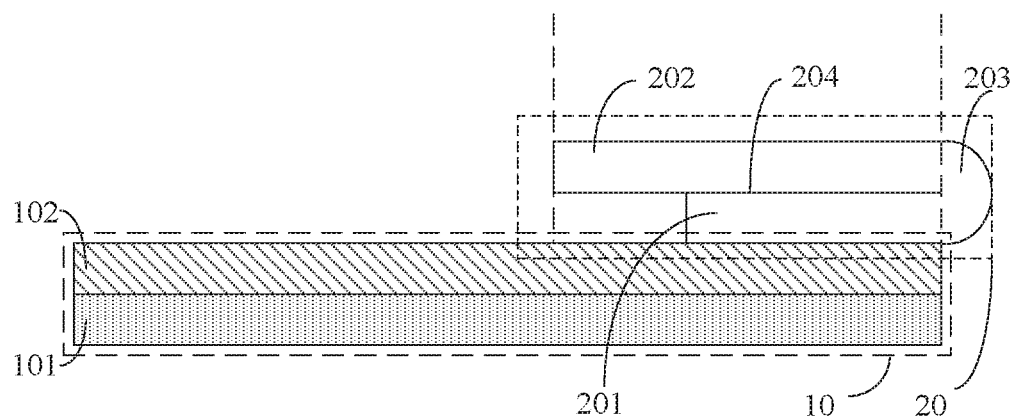
FIG. 2 is another structural diagram of a structure for measuring the bonding strength of a light-emitting panel according to an embodiment of the present disclosure.

Referring to FIG. 2, FIG. 2 is another structural diagram of a structure for measuring the bonding strength of a light-emitting panel according to an embodiment of the present disclosure.

FIG. 2 shows a situation where the non-bonding portion 202 of the flip chip film 20 is covered on the bonding portion 201, wherein the non-bonding portion 202 and the bonding portion 201 form a small angle of 0°.

The structure 100 for measuring the bonding strength of the light-emitting panel includes: a substrate 10 on which a flip chip film 20 is disposed, and the bonding portion 201 of the flip chip film 20 is bonding to the substrate 10 The non-bonding portion 202 of the flip chip film 20 is covered on the bonding portion 201, and the non-bonding portion 202 is horizontally stretched to measure a bonding strength between the flip chip film 20 and a substrate 10.

In some embodiments, a horizontal length of the bonding portion 201 is smaller than a horizontal length of the non-bonding portion 202 to cause a mechanical arm to stretch the non-bonding portion 202.

In some embodiments, a first surface 204 of the flip chip film 20 is a smooth surface to reduce a friction between the non-bonding portion 202 and the bonding portion 201 when the non-bonding portion 202 is stretched.

Specifically, when the non-bonding portion 202 covers the bonding portion 201, the non-bonding portion 202 reserves some portions so that the mechanical arm can fit the non-bonding portion 202. Further, when the non-bonding portion 202 is horizontally stretched, the measured bonding strength is affected by the contact friction between the bonding portion 201 and the non-bonding portion 202. Therefore, the first surface 204 of the flip chip film 20 can be made into a smooth surface, and after the non-bonding portion 202 comes into contact with the bonding portion 201, the friction between the bonding portion 201 and the non-bonding portion 202 can be reduced. To improve the accuracy of the measurement.

The structure 100 for measuring the bonding strength of the light-emitting panel provided by the embodiment of the present disclosure includes a substrate 10 on which a flip chip 20 is disposed, and the bonding portion 201 of the flip chip film 20 is bonded to the substrate 10. On the substrate 10; wherein the orthographic projection of the non-bonding portion 202 of the flip chip film 20 on the substrate 10 covers the orthographic projection of the bonding portion 201 on the substrate 10, and the non-bonding portion 202 is stretched to measure a bonding strength of the flip chip film 20 and the substrate 10.

The risk of interlaminar fracture within the substrate 10 can be reduced, thereby more accurately measuring the bonding strength of the flip chip film 20 to the substrate 10.

Figure 3:
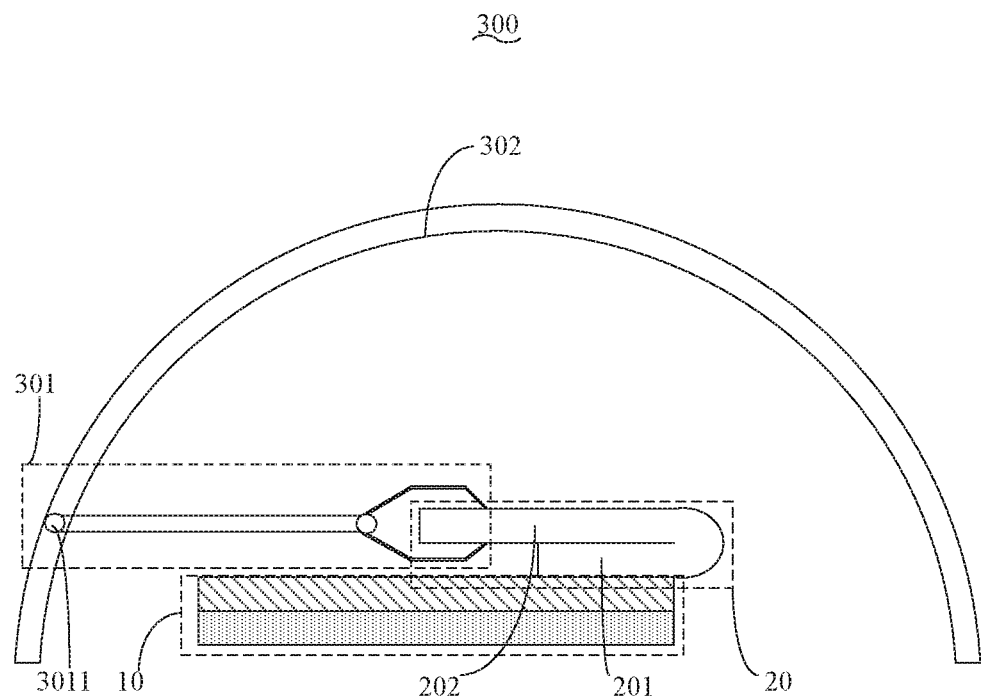
FIG. 3 is a structural diagram of a detecting apparatus for measuring the bonding strength of a light-emitting panel according to an embodiment of the present disclosure.

The embodiment of the present disclosure further provides a testing device for measuring the bonding strength of the light-emitting panel. Referring to FIG. 3, FIG. 3 is a structural diagram of a testing device for measuring the bonding strength of the light-emitting panel according to an embodiment of the present disclosure. The testing device 300 for measuring the bonding strength of the light emitting panel comprises:

A mechanical arm 301 and a slide rail 302, wherein the mechanical arm 301 is connected to the slide rail 302 through a pulley 3011 at the end;

The mechanical arm 301 is configured to fit the non-bonding portion 202 of the flip chip film 20 so that the non-bonding portion 202 covers the bonding portion 201 of the flip chip film 20, and the non-bonding portion is stretched to measure a bonding strength between the flip chip film 20 and a substrate 10.

Specifically, the testing device 300 for measuring the bonding strength of the light-emitting panel is included of a mechanical arm 301 and a sliding rail 302 connecting the mechanical arm 301. The mechanical arm 301 is connected to the sliding rail 302 through a pulley 3011, in actual production and processing. The movement of the pulley 3011 in the slide rail 302 can be controlled by an electromagnetic effect or the like.

In some embodiments, the slide rail 302 is semicircular such that the non-bonding portion 202 is covered on the bonding portion 201 by being rotated 180°.

It can be understood that, in order to achieve the effect of horizontal stretching, after the mechanical arm is engaged with the non-bonding portion 202, the non-bonding portion 202 needs to be rotated 180° over the bonding portion 201. Therefore, it is necessary to provide a half circular slide 302.

Figure 4:
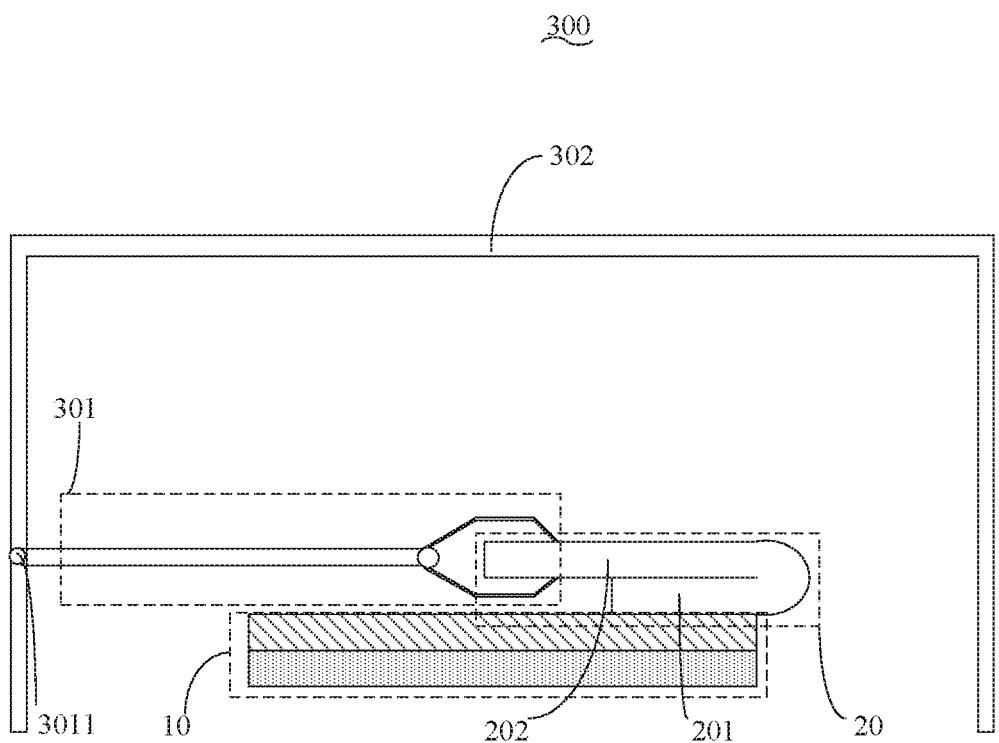
FIG. 4 is another structural diagram of a detecting apparatus for measuring the bonding strength of a light-emitting panel according to an embodiment of the present disclosure.

Please refer to FIG. 4, FIG. 4 is another structural diagram of a testing device for measuring the bonding strength of a light-emitting panel according to an embodiment of the present disclosure.

In some embodiments, the slide rails 302 are rectangular in shape.

In order to achieve horizontal stretching, it is only necessary to allow the robot arm 301 to be placed horizontally, and therefore, the rectangular-shaped slide rail 302 can also achieve the above effects.

Figure 5:
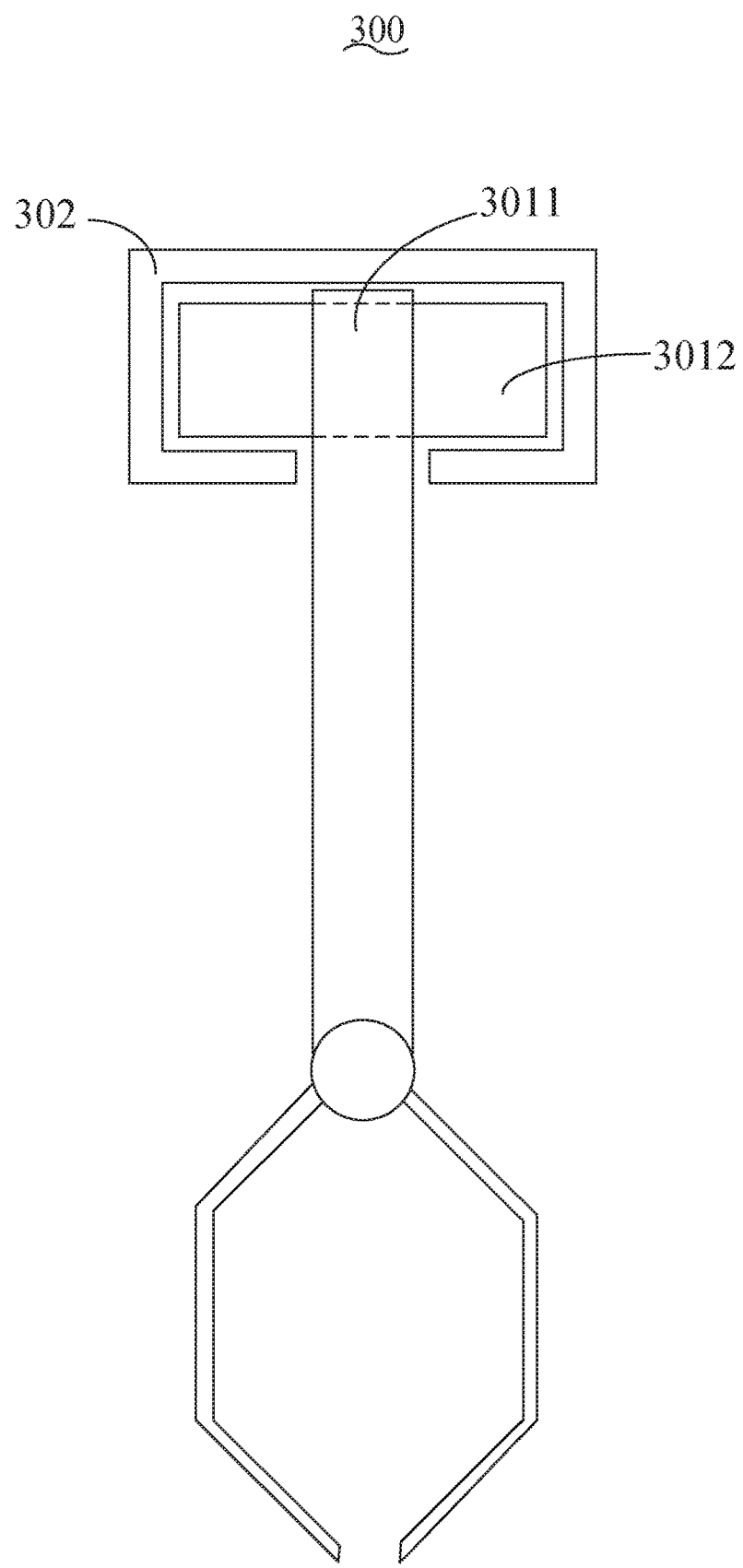
FIG. 5 is a structural diagram of a mechanical arm end pulley in a detecting device for measuring the bonding strength of a light-emitting panel according to an embodiment of the present disclosure.

Please refer to FIG. 5, FIG. 5 is a structural diagram of a mechanical arm end pulley in a testing device for measuring the bonding strength of a light emitting panel according to an embodiment of the present disclosure.

In some embodiments, a two sides of the pulleys 3011 are oppositely disposed with convex portions 3012 so that the pulleys 3011 abut against the sliding rails 302.

The testing device 300 for measuring the bonding strength of the light-emitting panel provided by the embodiment of the present disclosure, the structure for measuring the bonding strength of the light emitting panel includes: a mechanical arm 301 and a sliding rail 302, and the mechanical arm 301 passes through the end pulley 3011. The sliding arm 302 is connected to the sliding rail 302. The mechanical arm 301 is configured to fit the non-bonding portion 202 of the flip chip film 20 so that the non-bonding portion 202 covers the bonding portion 201 of the flip chip film 20. The bonding strength of the flip chip film 20 and the substrate 10 is measured by stretching the non-bonding portion 202. The risk of interlaminar fracture within the substrate 10 can be reduced, thereby more accurately measuring the bonding strength of the flip chip film 20 to the substrate 10.

The embodiment of the present disclosure further provides a structure for measuring the bonding strength of the light-emitting panel, which includes:

A substrate 10 on which a flip chip film 20 is disposed, and the bonding portion 201 of the flip chip film 20 is bonded to the substrate 10;

An orthographic projection of an non-bonding portion 202 of the flip chip film 20 on the substrate 10 covers the orthographic projection of the bonding portion 201 on the substrate 10, and the non-bonding portion 202 is stretched to measure a bonding strength between the flip chip film 20 and the substrate 10, wherein a bent portion 203 is formed between the bonding portion 201 and the non-bonding portion 202, and a first surface 204 of the flip chip film 20 is a smooth surface to reduce a friction between the non-bonding portion 202 and the bonding portion 201 when the non-bonding portion 202 is stretched.

In the above embodiments, the descriptions of the various embodiments are different, and the details that are not detailed in a certain embodiment can be referred to the related descriptions of other embodiments.

The above is a detailed description of a structure for measuring the bonding strength of a light-emitting panel and a testing device for measuring the bonding strength of the light-emitting panel provided by the embodiments of the present disclosure, and the specific examples are applied herein to the principle and implementation of the present disclosure. The manners of the above embodiments are only used to help understand the technical solutions of the present disclosure and the core ideas thereof; those of ordinary skill in the art should understand that they can still modify the technical solutions described in the foregoing embodiments. Equivalent replacement of some of the technical features may be made without departing from the scope of the technical solutions of the embodiments of the present application.

What is claimed is:

1. A structure for measuring a bonding strength of a light-emitting panel, comprising:
   a substrate on which a flip chip film is disposed, and a bonding portion of the flip chip film is bonded on the substrate; and
   an orthographic projection of a non-bonding portion of the flip chip film on the substrate covers an orthographic projection of the bonding portion on the substrate, and the non-bonding portion is stretched to measure a bonding strength of the flip chip film and the substrate.

2. The structure for measuring the bonding strength of a light-emitting panel according to claim 1, wherein a stretching direction of the non-bonding portion is an inclined direction of the non-bonding portion.

3. The structure for measuring the bonding strength of a light-emitting panel according to claim 1, wherein a bent portion is formed between the bonding portion and the non-bonding portion, and the flip chip film is bent by the bent portion.

4. The structure for measuring the bonding strength of a light-emitting panel according to claim 3, wherein the bent portion is aligned with an end of the substrate.

5. The structure for measuring the bonding strength of a light-emitting panel according to claim 3, wherein a horizontal length of the bonding portion is smaller than a horizontal length of the non-bonding portion to cause a mechanical arm to stretch the non-bonding portion.

6. The structure for measuring the bonding strength of a light-emitting panel according to claim 1, wherein the substrate comprises a bottom plate and a flexible layer, the flexible layer covering the substrate by stretching the non-bonding portion to prevent the flexible layer from separating from the bottom plate.

7. The structure for measuring the bonding strength of a light-emitting panel according to claim 1, wherein a first surface of the flip chip film is a smooth surface to reduce a friction between the non-bonding portion and the bonding portion when the non-bonding portion is stretched.

8. The structure for measuring the bonding strength of a light-emitting panel according to claim 1, wherein the substrate comprises: a bottom plate and a flexible layer, the flexible layer covering the bottom plate.

9. The structure for measuring the bonding strength of a light-emitting panel according to claim 8, wherein the flexible layer comprises polyimide.

10. A testing device for measuring a bonding strength of a light-emitting panel, comprising:
    a mechanical arm and a slide rail, the mechanical arm being connected to the slide rail by a pulley at the end; and
    the mechanical arm is configured to fit a non-bonding portion of a flip chip film so that the non-bonding portion covers a bonding portion of the flip chip film, and the non-bonding portion is stretched to measure a bonding strength between the flip chip film and a substrate.

11. The testing device for measuring the bonding strength of a light-emitting panel according to claim 10, wherein two sides of the pulleys are oppositely disposed with convex portions so that the pulleys abut against the sliding rails.

12. The testing device for measuring the bonding strength of a light emitting panel according to claim 10, wherein the sliding rail is semicircular, so that the non-bonding portion is covered on the bonding portion by being rotated 180°.

13. A structure for measuring the bonding strength of a light-emitting panel, comprising:
   a substrate on which a flip chip film is disposed, and a bonding portion of the flip chip film is bonded to the substrate; and
   an orthographic projection of a non-bonding portion of the flip chip film on the substrate covers an orthographic projection of the bonding portion on the substrate, and the non-bonding portion is stretched to measure a bonding strength of the flip chip film and the substrate, wherein a bent portion is formed between the bonding portion and the non-bonding portion, and the flip chip film is bent by the bent portion, and a first surface of the flip chip film is a smooth surface to reduce a friction between the non-bonding portion and the bonding portion when the non-bonding portion is stretched.

* * * * *